US012628288B2

(12) United States Patent
Lin

(10) Patent No.: US 12,628,288 B2
(45) Date of Patent: May 12, 2026

(54) DISPLAY MODULE AND DISPLAY APPARATUS

(71) Applicant: BOE TECHNOLOGY GROUP CO., LTD., Chaoyang District (CN)

(72) Inventor: Xinqi Lin, Beijing (CN)

(73) Assignee: BOE Technology Group Co., Ltd., Chaoyang District (CN)

( * ) Notice: Subject to any disclaimer, the term of this patent is extended or adjusted under 35 U.S.C. 154(b) by 172 days.

(21) Appl. No.: 18/292,952

(22) PCT Filed: Sep. 28, 2022

(86) PCT No.: PCT/CN2022/122286
§ 371 (c)(1),
(2) Date: Jan. 29, 2024

(87) PCT Pub. No.: WO2024/065316
PCT Pub. Date: Apr. 4, 2024

(65) Prior Publication Data
US 2025/0089185 A1     Mar. 13, 2025

(51) Int. Cl.
*H05K 5/02*          (2006.01)
*G06F 1/16*          (2006.01)

(52) U.S. Cl.
CPC ......... *H05K 5/0217* (2013.01); *G06F 1/1624* (2013.01); *G06F 1/1652* (2013.01)

(58) Field of Classification Search
CPC ... H05K 5/0217; G06F 1/1624; G06F 1/1637; G06F 1/1652; G09F 9/30; G09G 3/00
See application file for complete search history.

(56) References Cited

U.S. PATENT DOCUMENTS

| | | | | | |
|---|---|---|---|---|---|
| 12,376,242 | B2 * | 7/2025 | Cho | ...................... | G06F 1/1624 |
| 2018/0103552 | A1 * | 4/2018 | Seo | ......................... | G09F 9/301 |
| 2021/0007229 | A1 * | 1/2021 | Gu | ......................... | G06F 1/1652 |
| 2021/0029838 | A1 | 1/2021 | Lee et al. | | |
| 2021/0265590 | A1 * | 8/2021 | Wang | ................... | H10K 77/111 |
| 2022/0078270 | A1 * | 3/2022 | Song | ................... | H04M 1/0235 |
| 2022/0155823 | A1 * | 5/2022 | Shin | ........................ | G09F 9/301 |
| 2022/0221907 | A1 | 7/2022 | Cai et al. | | |
| 2022/0253103 | A1 * | 8/2022 | Choi | ..................... | G06F 1/1624 |
| 2022/0255023 | A1 * | 8/2022 | Cai | ........................ | B32B 3/14 |

(Continued)

FOREIGN PATENT DOCUMENTS

| | | |
|---|---|---|
| CN | 110189638 A | 8/2019 |
| CN | 111312660 A | 6/2020 |

(Continued)

*Primary Examiner* — Sagar Shrestha
(74) *Attorney, Agent, or Firm* — The Webb Law Firm

(57) ABSTRACT

A display module includes a display panel, a first support layer, a second support layer and an adhesive layer. The display panel includes a bendable portion. The second support layer includes a plurality of support bars arranged at intervals, and there is a first gap between two adjacent support bars in the plurality of support bars. The adhesive layer includes a plurality of first portions arranged at intervals and a connection portion. There is a second gap between two adjacent first portions in the plurality of first portions. The second gap is communicated with the first gap. The connection portion connects the plurality of first portions, so that the plurality of first portions are connected by the connection portion.

14 Claims, 6 Drawing Sheets

(56) References Cited

U.S. PATENT DOCUMENTS

| | | | |
|---|---|---|---|
| 2023/0075243 A1* | 3/2023 | Song | G06F 1/1681 |
| 2023/0176621 A1 | 6/2023 | Zhou et al. | |
| 2023/0176624 A1* | 6/2023 | Kim | G06F 1/1637 |
| 2023/0205272 A1* | 6/2023 | Park | G06F 1/1652 |
| | | | 361/679.01 |
| 2024/0025141 A1 | 1/2024 | Cheng | |
| 2024/0045471 A1* | 2/2024 | Wang | |
| 2024/0057270 A1* | 2/2024 | Zhang | H10D 86/411 |
| 2024/0153418 A1* | 5/2024 | Ha | H05K 7/18 |
| 2024/0310876 A1* | 9/2024 | Zhao | G06F 1/1656 |
| 2024/0324123 A1* | 9/2024 | Kim | H05K 5/0217 |

FOREIGN PATENT DOCUMENTS

| | | |
|---|---|---|
| CN | 111862824 A | 10/2020 |
| CN | 212783456 U | 3/2021 |
| CN | 113362712 A | 9/2021 |
| CN | 214336182 U | 10/2021 |
| CN | 113724631 A | 11/2021 |
| CN | 114023192 A | 2/2022 |
| CN | 114170912 A | 3/2022 |
| CN | 114446173 A | 5/2022 |

* cited by examiner

10

100

DISPLAY MODULE AND DISPLAY APPARATUS

CROSS-REFERENCE TO RELATED APPLICATION

This application is the United States national phase of International Patent Application No. PCT/CN2022/122286, filed Sep. 28, 2022, the disclosure of which is hereby incorporated by reference in its entirety.

BACKGROUND OF THE INVENTION

Field of the Invention

The present disclosure relates to the field of display technologies, and in particular, to a display module and a display apparatus.

Description of Related Art

The display apparatus may display various images through the display screen to provide a variety of information for users. In recent years, flexible display apparatuses developed based on flexible substrates have greatly improved use convenience for users due to their rollable or bendable properties.

SUMMARY OF THE INVENTION

In an aspect, a display module is provided. The display module includes a display panel, a first support layer, a second support layer and an adhesive layer. The display panel includes a bendable portion. The first support layer is located on a back surface of the display panel, and the back surface is a surface of the display panel opposite to a display surface. The second support layer is located on a side of the first support layer away from the display panel. The second support layer includes a plurality of support bars, and orthographic projections of the plurality of support bars on the display panel are located within the bendable portion. The plurality of support bars are disposed at intervals, and two adjacent support bars in the plurality of support bars have a first gap therebetween. The adhesive layer is located between the second support layer and the first support layer. The adhesive layer includes a plurality of first portions and a connection portion. Orthographic projections of the plurality of first portions on the display panel are located within the bendable portion. The plurality of first portions are disposed at intervals, and two adjacent first portions in the plurality of first portions have a second gap therebetween. The second gap is communicated with the first gap. The connection portion connects the plurality of first portions.

In some embodiments, the plurality of support bars and the plurality of first portions all extend in a first direction, and the first direction is parallel to the first support layer. An orthographic projection of a single support bar on the display panel and an orthographic projection of at least one first portion on the display panel have an overlap.

In some embodiments, the orthographic projection of the single support bar on the display panel is located within an orthographic projection of a first portion on the display panel.

In some embodiments, each first portion includes a first end portion and a second end portion in the first direction. The connecting portion includes a first connecting portion and a second connecting portion. The first connection portion connects first end portions of at least two first portions, and the second connection portion connects second end portions of at least two first portions.

In some embodiments, the first connection portion includes a plurality of first connection segments, and the second connection portion includes a plurality of second connection segments. For three adjacent first portions, first end portions of first two first portions are connected by a first connection segment, and second end portions of last two first portions are connected by a second connection segment.

In some embodiments, a first connection segment is located between first end portions of two adjacent first portions, and a second connection segment is located between second end portions of two adjacent first portions.

In some embodiments, the connecting portion further includes at least one third connection segment. In the plurality of first portions, first end portions of two adjacent first portions located on an outermost side are connected by a third connection segment. And/or in the plurality of first portions, second end portions of two adjacent first portions located on an outermost side are connected by another third connection segment.

In some embodiments, the connecting portion includes a fourth connection portion. Each first portion includes a first end portion and a second end portion in the first direction, and a main portion located between the first end portion and the second end portion. The fourth connection portion connects main portions of at least two first portions.

In some embodiments, a second direction is perpendicular to the first direction and parallel to the first support layer. The fourth connection portion includes a plurality of fourth connection groups, and the plurality of fourth connection groups are disposed at intervals in the first direction. At least one fourth connection group includes a plurality of fourth connection segments, and fourth connection segments in a same fourth connection group and the at least two first portions are disposed alternately in the second direction.

In some embodiments, at least one end surface of a fourth connection segment in the first direction includes a curved surface, and the curved surface is concave inward the fourth connection segment.

In some embodiments, a side of the curved surface is tangent to a first portion of two adjacent first portions, and another side of the curved surface is tangent to another first portion of the two adjacent first portions.

In some embodiments, the adhesive layer includes a base material layer, a first adhesive layer and a second adhesive layer. The first adhesive layer is located on a side of the base material layer proximate to the first support layer, and the second adhesive layer is located on a side of the base material layer proximate to the second support layer.

In some embodiments, a material of the base material layer includes one or a combination of polyethylene terephthalate, thermoplastic polyurethane elastomer rubber, polyurethane foam, polyethylene foam, or polyvinyl chloride foam.

In some embodiments, the plurality of first portions and the connection portion are of an integral structure.

In some embodiments, the display panel further includes a planar portion, and the planar portion is connected to the bendable portion. The second support layer further includes a support plate, and an orthographic projection of the support plate on the display panel is located within the planar portion. The adhesive layer further includes a second portion, and an orthographic projection of the second portion on the display panel is located within the planar portion.

In some embodiments, a first portion located on an outermost side in the plurality of first portions and the second portion have a third gap therebetween.

In some embodiments, the display module further includes a rotating shaft. The rotating shaft is located on a side of the plurality of support bars away from the bendable portion, the rotating shaft is configured to drive the bendable portion to be curled or unfolded; and a center line of the rotating shaft is parallel to the first direction.

In another aspect, a display apparatus is provided. The display apparatus includes the display module as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DESCRIPTION OF THE INVENTION

Figure 1:
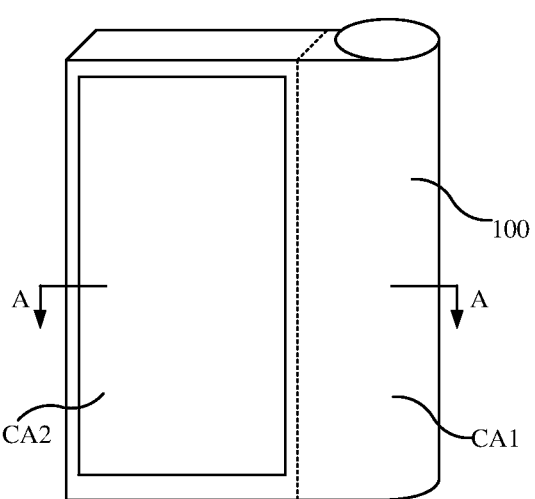
FIG. 1 is a structural diagram of a display apparatus, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The phrase "applicable to" or "configured to" as used herein indicates an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

FIG. 1 is a structural diagram of a display apparatus in accordance with some embodiments. Referring to FIG. 1, the display apparatus 10 is a product having a function of displaying images (including an image in stationary, or an image in motion which may be a video). For example, the display apparatus 10 may be any of a display, a television, a billboard, a digital photo frame, a laser printer having a display function, a telephone, a mobile phone, a personal digital assistant (PDA), a digital camera, a portable camcorder, a view finder, a navigator, a vehicle, a large-area wall, a household appliance, an information inquiry device (e.g., a business inquiry device for a department of e-government, bank, hospital, electricity or the like) and a monitor. The display apparatus 10 includes a display module 100 in any of embodiments described below.

Figure 2:
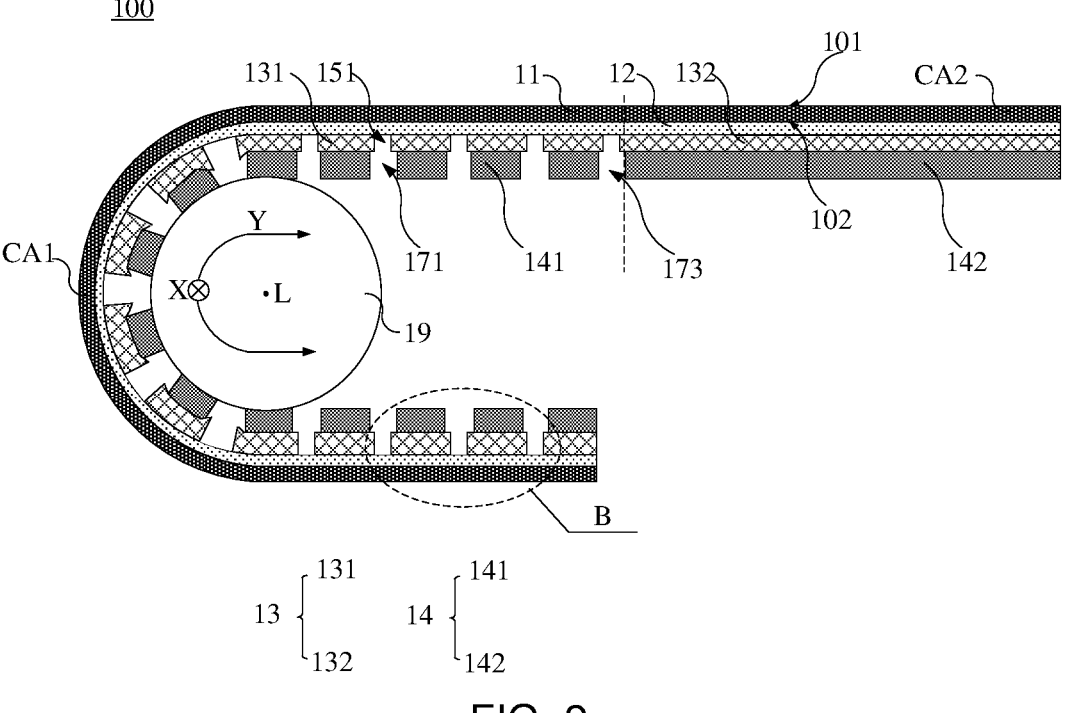
FIG. 2 is a sectional view of a display module in the display apparatus in FIG. 1 taken along the section line A-A.

FIG. 2 is a sectional view of a display module 100 in the display apparatus 10 in FIG. 1 taken along the section line A-A. As shown in FIG. 2, the display module 100 includes a display panel 11, a first support layer 12, an adhesive layer 13 and a second support layer 14.

The display panel 11 includes a bendable portion CA1, so that the bendable portion CA1 has a curved shape. For example, the display panel 11 may be one of an organic light-emitting diode (OLED) display panel, a quantum dot light-emitting diode (QLED) display panel, and a tiny light-emitting diode (tiny LED including a mini LED or a micro LED) display panel.

In some embodiments, the display panel 11 further includes a planar portion CA2, and the planar portion CA2 is connected to the bendable portion CA1. The planar portion CA2 is used for display in a plane manner. The bendable portion CA1 may be bent at different positions, so that the bendable portion CA1 is used for display in a scrollable manner. Furthermore, a surface of the display panel 11 is a display surface 101, and the display surface 101 is used for displaying images. A surface opposite to the display surface 101 is a back surface 102 of the display panel 11. When a display area of the display panel 11 needs to be enlarged, part of the bendable portion CA1 may be switched from a bent state to a planar state, so that part of a surface of the bendable portion CA1 and a surface of the planar portion CA2 are located in the same plane, so as to increase the size of the screen of the display panel 11, thereby meeting the viewing needs. When the display area of the display panel 11 needs to be reduced, the bendable portion CA1 is switched from the planar state to the bent state, so that part of the bendable portion CA1 scrolls to a side of the planar portion CA2, thereby reducing the size of the screen of the display panel 11 and making the display apparatus 10 portable.

In some embodiments, the display panel 11 includes a driving display layer and a protective layer that are stacked. The driving display layer is used to display images. The protective layer is located on a side of the driving display layer proximate to the display surface 101, and the protective layer plays a role of isolation and protection.

The first support layer 12 is located on a back surface 102 of the display panel 11, and the back surface 102 is a surface of the display panel 11 opposite to the display surface 101. The first support layer 12 plays a role of planarization, which is beneficial to reducing a molding effect of the second support layer 14 and improving the display effect of the display panel 11. In some embodiments, the material of the first support layer 12 may include metal (e.g., stainless steel or titanium alloy), carbon fiber, or the like. The thickness of the first support layer 12 may be in a range of 20 μm to 500 μm, inclusive. For example, the thickness of the first support layer 12 may be 20 μm, 250 μm or 500 μm.

The second support layer 14 is located on a side of the first support layer 12 away from the display panel 11. The second support layer 14 includes a plurality of support bars 141, and orthographic projections of the plurality of support bars 141 on the display panel 11 are located within the bendable portion CA1. The plurality of support bars 141 are disposed at intervals, and there is a first gap 171 between two adjacent support bars 141 in the plurality of support bars 141. For example, the material of the support bar 141 may include stainless steel (SUS), titanium alloy, and other easy-to-process metals. As shown in FIG. 2, the plurality of support bars 141 may extend in the same direction. For example, the plurality of support bars 141 may extend in a first direction X, and the first direction X is parallel to a surface of the first support layer 12. The plurality of support bars 141 are arranged at equal intervals, that is, a plurality of first gaps 171 are all equal. The above provision facilitates the second support layer 14 reaching a bent or unfolded state, so as to support the bendable portion CA1, and is also beneficial to improving the regularity of the second support layer 14.

In the embodiments in which the display panel 11 further includes the planar portion CA2, the second support layer 14 may further include a support plate 142. An orthographic projection of the support plate 142 on the display panel 11 is located within the planar portion CA2, so as to facilitate the support of the planar portion CA2 by the support plate 142. For example, the support plate 142 and the support bars 141 are provided in the same layer, and there may be a certain gap between the support plate 142 and the support bars 141. In some embodiments, the support plate 142 may be made of the same material as the support bars 141, and details are not repeated here.

In some embodiments, the display module 100 may further include a rotating shaft 19, and the rotating shaft 19 is located on a side of the plurality of support bars 141 away from the bendable portion CA1. The rotating shaft 19 is configured to drive the bendable portion CA1 to be curled or unfolded. A center line L of the rotating shaft 19 is parallel to the first direction X. For example, the rotating shaft 19 generally has a cylindrical structure. Surfaces of multiple support bars 141 away from the bendable portion CA1 are in contact with a circumferential side wall of the rotating shaft 19, and the extending direction of the plurality of supporting bars 141 is parallel to the center line L of the rotating shaft 19. During actual use, the rotating shaft 19 may rotate around its center line L, and thus drives the support bars 141 in contact with the rotating shaft 19 to move along the circumferential side wall of the rotating shaft 19. The moving support bars 141 may drive the bendable portion CA1 to be curled or unfolded, so as to reduce or increase the size of the screen of the display panel 11.

Figure 3:
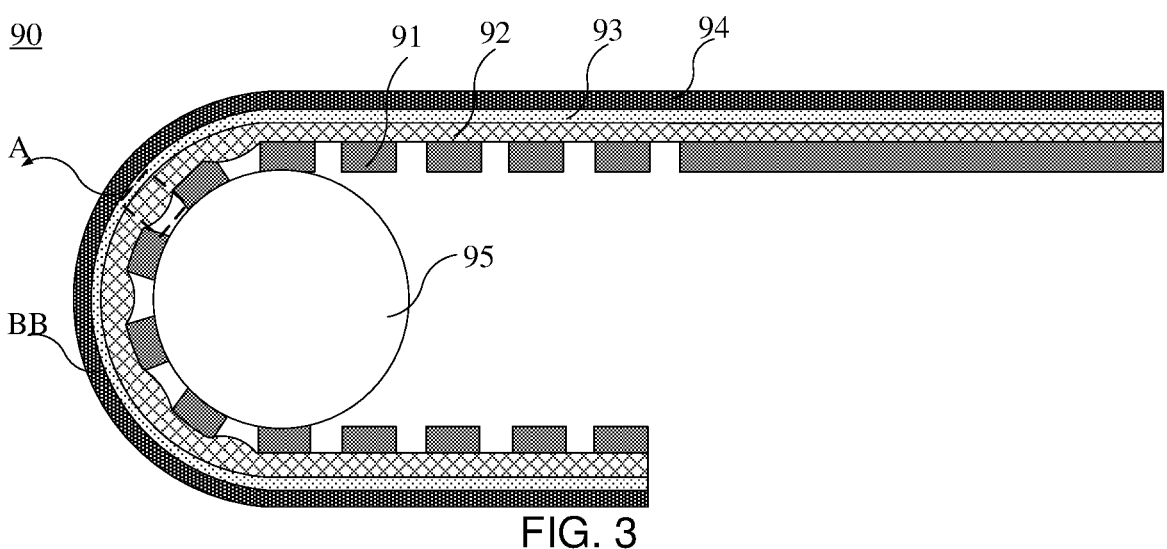
FIG. 3 is a structural diagram of a display apparatus in the related art.

The adhesive layer 13 is located between the second support layer 14 and the first support layer 12. The adhesive layer 13 is used to bond the second support layer 14 and the first support layer 12 together. FIG. 3 is a structural diagram of a display apparatus 90 in the related art. As shown in FIG. 3, in the related art, an adhesive layer 92 may be a whole layer of adhesive material. When a rotating shaft 95 drives a bendable portion BB to scroll, compression occurs between support bars 91 and the adhesive layer 92, and a partial area A of the adhesive layer 92 undergoes compression deformation, so that peeling occurs between the adhesive layer 92 and a first support layer 93, and further misalignment of the support bars 91 may be caused. As a result, a display panel 94 is prone to jamming when scroll. Here, "the area A" is an area of the adhesive layer 92 without the support bar 91 attached.

In light of this, in the display module 100 provided by some embodiments of the present disclosure, the adhesive layer 13 includes a plurality of first portions 131. Orthographic projections of the plurality of first portions 131 on the display panel 11 are located within the bendable portion CA1, so that the plurality of first portions 131 are used to connect the plurality of support bars 141 and the first support layer 12 together. The plurality of first portions 131 are arranged at intervals, and there is a second gap 151 between two adjacent first portions 131 in the plurality of first portions 131. The second gap 151 is communicated with the first gap 171 to reduce an area of the adhesive layer 13 that is squeezed by the support bar 141 and deformed, so as to prevent the adhesive layer 13 from being squeezed and deformed, which is beneficial to avoiding peeling between the adhesive layer 13 and the first support layer 12. Therefore, the stability of the support bars 141 may be improved, thereby avoiding jamming when the display panel 11 scrolls.

It is worth noting that the following will be described by considering an example where the first direction X is parallel to the first support layer 12 and parallel to the center line of the rotating shaft 19, and the second direction Y is perpendicular to the first direction X and is parallel to the first support layer 12.

Figure 4:
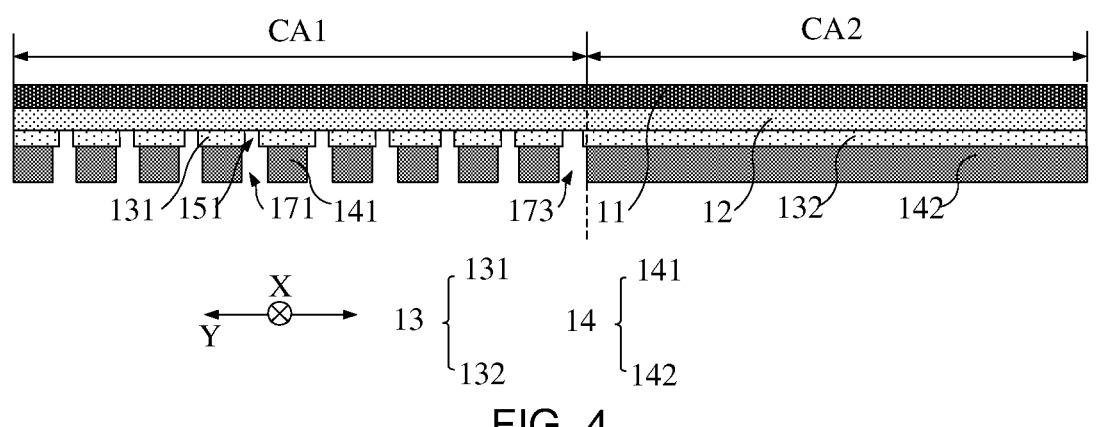
FIG. 4 is a structural diagram of the display module in FIG. 2 with a rotating shaft removed.
Figure 5:
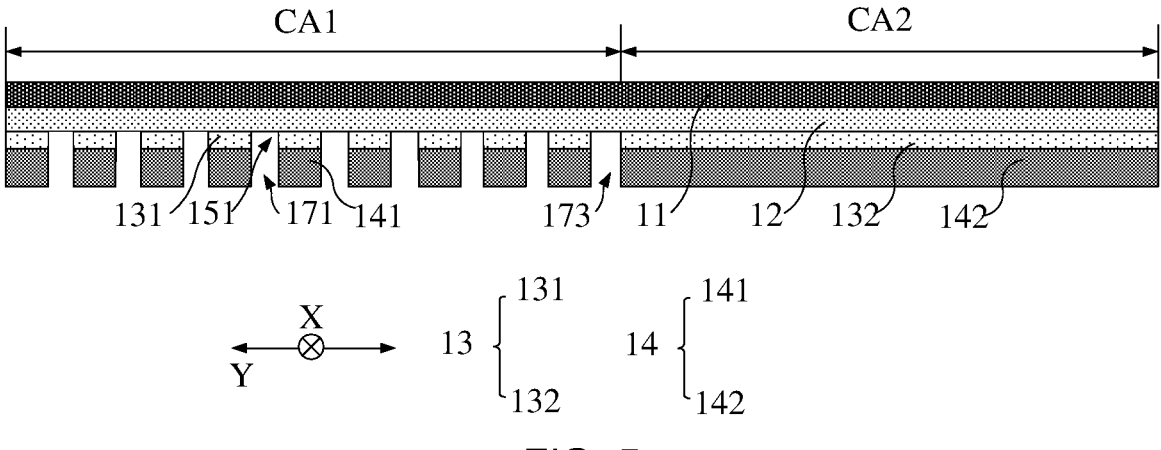
FIG. 5 is a structural diagram of another display module with a rotating shaft removed, in accordance with some embodiments.
Figure 6:
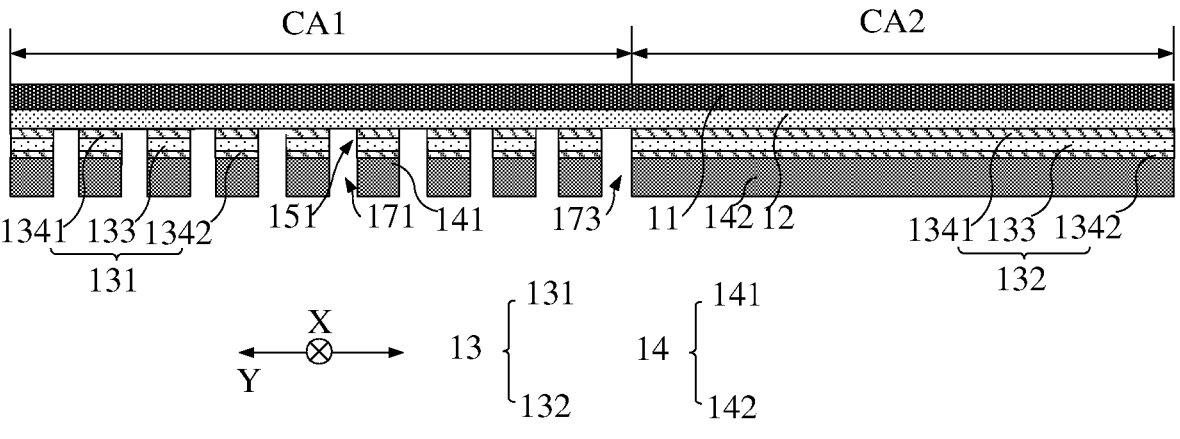
FIG. 6 is a structural diagram of yet another display module with a rotating shaft removed, in accordance with some embodiments.
Figure 7:
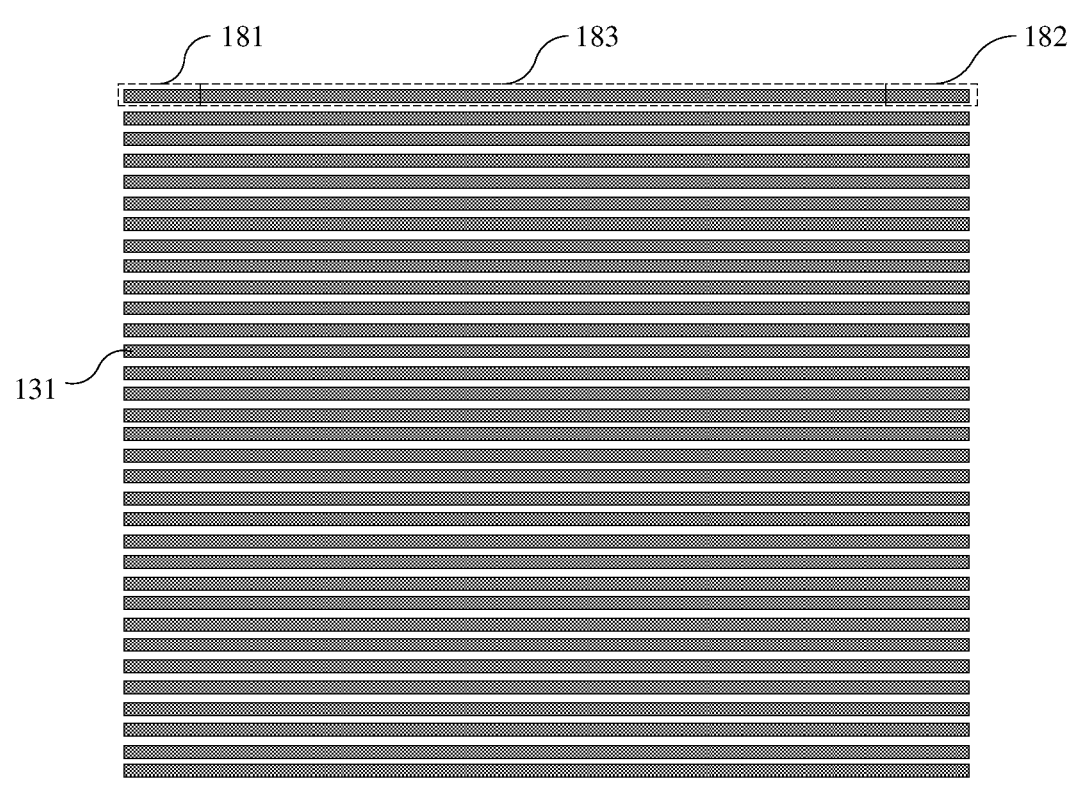
FIG. 7 is a structural diagram of first portions of an adhesive layer, in accordance with some embodiments.
Figure 7:
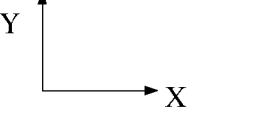

FIG. 4 is a structural diagram of the display module 100 in FIG. 2 with a rotating shaft 19 removed. FIG. 5 is a structural diagram of another display module 100 with the rotating shaft removed in accordance with some embodiments. FIG. 6 is a structural diagram of yet another display module 100 with the rotating shaft removed in accordance with some embodiments. FIG. 7 is a structural diagram of the first portions 131 of the adhesive layer 13 in accordance with some embodiments.

Referring to FIGS. 4, 5, 6 and 7, in some embodiments, the plurality of first portions 131 and the plurality of support bars 141 all extend in the first direction X, which is beneficial to further improving the regularity of the display module 100, and ensuring the bonding effect between the first portions 131 and the support bars 141. There is an overlap between an orthographic projection of a single support bar 141 on the display panel 11 and an orthographic projection of at least one first portion 131 on the display panel 11. The above provision is beneficial to ensuring the bonding between the single support bar 141 and the at least one first portion 131, thereby ensuring that the second support layer 14 is bonded to the first support layer 12 by the adhesive layer 13.

In some embodiments, the orthographic projection of the single support bar 141 on the display panel 11 is located within an orthographic projection of a first portion 131 on the display panel 11. For example, as shown in FIG. 4, a side surface of a first portion 131 in the second direction Y may exceed a side surface of a support bar 141 in the second direction Y. Alternatively, as shown in FIG. 5, an orthographic projection of a support bar 141 on the display panel 11 and an orthographic projection of a first portion 131 on the display panel 11 may coincide completely.

Referring to FIG. 6, in some embodiments, the adhesive layer 13 may include a base material layer 133, a first adhesive layer 1341 and a second adhesive layer 1342. The first adhesive layer 1341 is located on a side of the base material layer 133 proximate to the first support layer 12, and the second adhesive layer 1342 is located on a side of the base material layer 133 proximate to the second support layer 14. The above provision is beneficial to ensuring the bonding effect of the adhesive layer 13. In addition, the provision of the base material layer 133 is beneficial to further realizing the planarization effect of the first support layer 12, further reducing the molding effect of the second support layer 14, and further improving the display effect of the display panel 11. For example, the thickness of the adhesive layer 13 may be in a range of 0.015 mm to 0.1 mm, inclusive.

In some embodiments, the adhesive layer 13 may further include a first protective layer and a second protective layer. The first protective layer is located on a side of the first adhesive layer 1341 away from the second adhesive layer 1342, and the second protective layer is located on a side of the second adhesive layer 1342 away from the first adhesive layer 1341. The provision of the first protective layer and the second protective layer may protect the first adhesive layer 1341 and the second adhesive layer 1342, respectively. In a specific application process, before the adhesive layer 13 is bonded between the first support layer 12 and the second support layer 14, the first protective layer and the second protective layer need to be peeled off.

In some embodiments, the material of the base material layer 133 may include one or a combination of polyethylene terephthalate (PET), thermoplastic polyurethane (TPU) elastomer rubber, polyurethane (PU) foam, polyethylene (PE) foam or polyvinyl chloride (PVC) foam, so as to ensure the bonding effect between the first support layer 12 and the second support layer 14.

In some other embodiments, the adhesive layer 13 may be a carrier-free adhesive film to ensure the bonding effect between the first support layer 12 and the second support layer 14. It is worth noting that the carrier-free adhesive film is also a pure adhesive film, which refers to an adhesive film without a carrier. The material of the carrier-free adhesive film includes thermoplastic resins (e.g., polyolefin-based resins, acrylate-based resins, polyvinyl alcohol-based resins, polyvinyl acetate-based resins, polyester amine-based resins and polyurethane-based resins) or thermoset resins (e.g., epoxy resins and phenolic resins).

Figure 8:
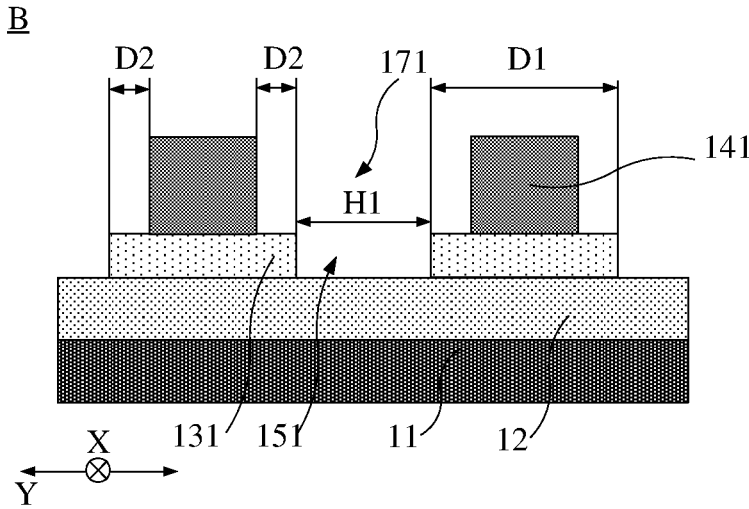
FIG. 8 is a partial enlarged view of the display module at a position of B in FIG. 2.

FIG. 8 is a partial enlarged view of a position of B in FIG. 2. As shown in FIG. 8, a width D1 of the first portion 131 in the second direction Y may be in a range of 0.5 mm to 3.2 mm, inclusive. For example, the width D1 of the first portion 131 in the second direction Y may be 0.5 mm, 1.5 mm, 2.5 mm or 3.2 mm. A distance D2 between a side face of the first portion 131 in the second direction Y and a side face of the support bar 141 in the second direction Y is in a range of 0.1 mm to 0.15 mm, inclusive. For example, the distance D2 between the side face of the first portion 131 in the second direction Y and the side face of the support bar 141 in the second direction Y may be 0.1 mm, 0.12 mm, 0.14 mm or 0.15 mm. Further, a distance H1 of the second gap 151 in the second direction Y may be in a range of 0.3 mm to 1 mm, inclusive. For example, the distance H1 of the second gap 151 in the second direction Y may be 0.3 mm, 0.6 mm, or 1 mm. The above provision is conducive to ensuring a bonding area between the first portion 131 and a corresponding support bar 141, improving the bonding effect and ensuring the stability of the support bar 141, thereby avoiding jamming when the display panel 11 scrolls.

Figure 9:
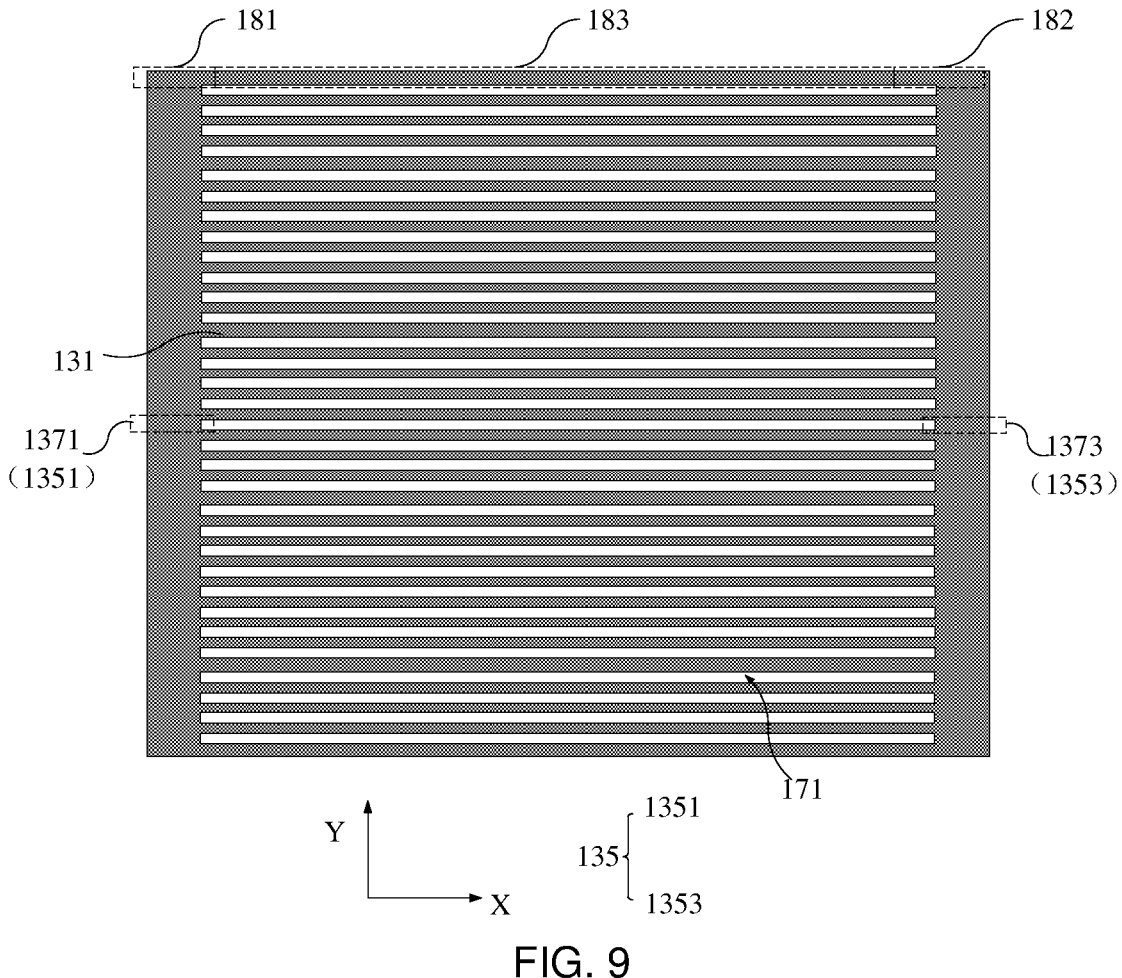
FIG. 9 is a structural diagram of first portions and a connection portion of an adhesive layer, in accordance with some embodiments.

FIG. 9 is a structural diagram of first portions 131 and a connection portion 135 of an adhesive layer 13 in accordance with some embodiments. Referring to FIG. 9, the adhesive layer 13 further includes a connection portion 135, and the connection portion 135 connects the plurality of first portions 131. By providing the connection portion 135, the plurality of first portions 131 may be connected by the connection portion 135, which is beneficial to improving the stability between the plurality of first portions 131 and further improving the stability between the support bars 141. Thus, jamming may further be avoided when the display panel 11 scrolls.

With continued reference to FIG. 2, in the embodiments in which the display panel 11 further includes the planar portion CA2, the adhesive layer 13 may further include a second portion 132. An orthographic projection of the second portion 132 on the display panel 11 is located within the planar portion CA2. For example, the second portion 132 and the first portions 131 are provided in the same layer, and the second portion 132 is provided to make the support plate 142 bonded to the first support layer 12.

In some embodiments, as shown in FIG. 2, there is a third gap 173 between the first portion 131 located on the outermost side in the plurality of first portions 131 and the second portion 132. It is worth noting that when the support bar 141 located on the outermost side in the plurality of support bars 141 is in contact with the rotating shaft 19, the first portion 131 located on the outermost side in the plurality of first portions 131 is squeezed. The provision of the third gap 173 between the first portion 131 and the second portion 132 is beneficial to reducing the local stress on the outermost first portion 131, thereby preventing the outermost support bar 141 from being dislocated.

To sum up, the adhesive layer 13 includes a plurality of first portions 131 and a connection portion 135. The plurality of first portions 131 are arranged at intervals, and there is a second gap 151 between two adjacent first portions 131 in the plurality of first portions 131. The second gap 151 is communicated with the first gap 171 to reduce an area of the adhesive layer 13 that is squeezed by the support bar 141 and deformed, so as to prevent the adhesive layer 13 from being squeezed and deformed, which is beneficial to avoiding peeling between the adhesive layer 13 and the first support layer 12. Therefore, the stability of the support bars 141 may be improved, thereby avoiding jamming when the display panel 11 scrolls. The connection portion 135 connects the plurality of first portions 131, so that the plurality of first portions 131 are connected by the connection portion 135, which is beneficial to improving the stability between the plurality of first portions 131 and further improving the stability between the support bars 141. Thus, jamming may further be avoided when the display panel 11 scrolls.

It is worth noting that in a case where the elastic modulus of the material of the adhesive layer 13 is relatively large, the rigidity of the adhesive layer 13 is relatively strong, and the adhesive layer 13 is less likely to bend. The above provision may reduce the area of the adhesive layer 13 that is squeezed the support bar 141 and deformed, and is also conducive for the adhesive layer 13 to selecting a material with a larger elastic modulus, thereby expanding the selection range of materials of the adhesive layer 13 and reducing the production costs. By adjusting the material of the adhesive layer 13, the elastic modulus of the adhesive layer 13 may further be adjusted. In some examples, the elastic modulus of the adhesive layer 13 may be in a range of 10 KPa to 700 MPa, inclusive. For example, the elastic modulus of the adhesive layer 13 may be 10 KPa, 10 MPa, 350 MPa, or 700 MPa.

With continued reference to FIG. 9, the first portion 131 may include a first end portion 181 and a second end portion 182 in the first direction X, and a main portion 183 located between the first end portion 181 and the second end portion 182. For example, the first end portion 181 may be located at the left end of the first portion 131 in the illustrated position, the second end portion 182 may be located at the right end of the first portion 131 in the illustrated position, and the main portion 183 may be located between the first end portion 181 and the second end portion 182, and the main portion 183 is connected to the first end portion 181 and the second end portion 182.

The connection portion 135 may include a first connection portion 1351 and a second connection portion 1353. The first connection portion 1351 may connect first end portions 181 of at least two first portions 131, and the second connection portion 1353 may connect second end portions 182 of at least two first portions 131. The provision of the first connection portion 1351 may achieve connection of the first end portions 181 of the at least two first portions 131, and the provision of the second connection portion 1353 may achieve connection of the second end portions 182 of the at least two first portions 131. Thus, this is beneficial to improving the stability of the first end portions 181 and the second end portions 182 of the first portions 131, thereby avoiding jamming when the display panel 11 scrolls.

As shown in FIG. 9, the first connection portion 1351 may include a plurality of first connection segments 1371, and a first connection segment 1371 may be located between first end portions 181 of two adjacent first portions 131. The second connection portion 1353 may include a plurality of second connection segments 1373, and a second connection segment 1373 may be located between second end portions 182 of two adjacent first portions 131. It is worth noting that by adjusting the numbers of the first connection segments 1371 and the second connection segments 1373, the number of the connected first end portions 181 and the number of the connected second end portions 182 may be controlled.

As shown in FIG. 9, in some embodiments, in the second direction Y, the plurality of first connection segments 1371 and some of the first end portions 181 of the plurality of first portions 131 may be alternately disposed, so that some of the first end portions 181 of the plurality of first portions 131 are connected together. And in the second direction Y, the plurality of second connection segments 1373 and some of the second end portions 182 of the plurality of first portions 131 may be alternately disposed, so that some of the second end portions 182 of the plurality of first portions 131 are connected together.

As shown in FIG. 9, in some other embodiments, in the second direction Y, the plurality of first connection segments 1371 and the plurality of first end portions 181 may be alternately disposed, so that the first end portions 181 of the plurality of first portions 131 are all connected together. And in the second direction Y, the plurality of second connection segments 1373 and the plurality of second end portions 182 may be alternately disposed, so that the second end portions 182 of the plurality of first portions 131 are all connected together. Thus, it is conducive to further increasing the bonding area between the adhesive layer 13 and the first support layer 12, further improving the bonding effect between the second support layer 14 and the first support layer 12 and further improving the stability of the first end portions 181 and the second end portions 182 of the first portions 131, thereby avoiding jamming when the display panel 11 scrolls.

Figure 10:
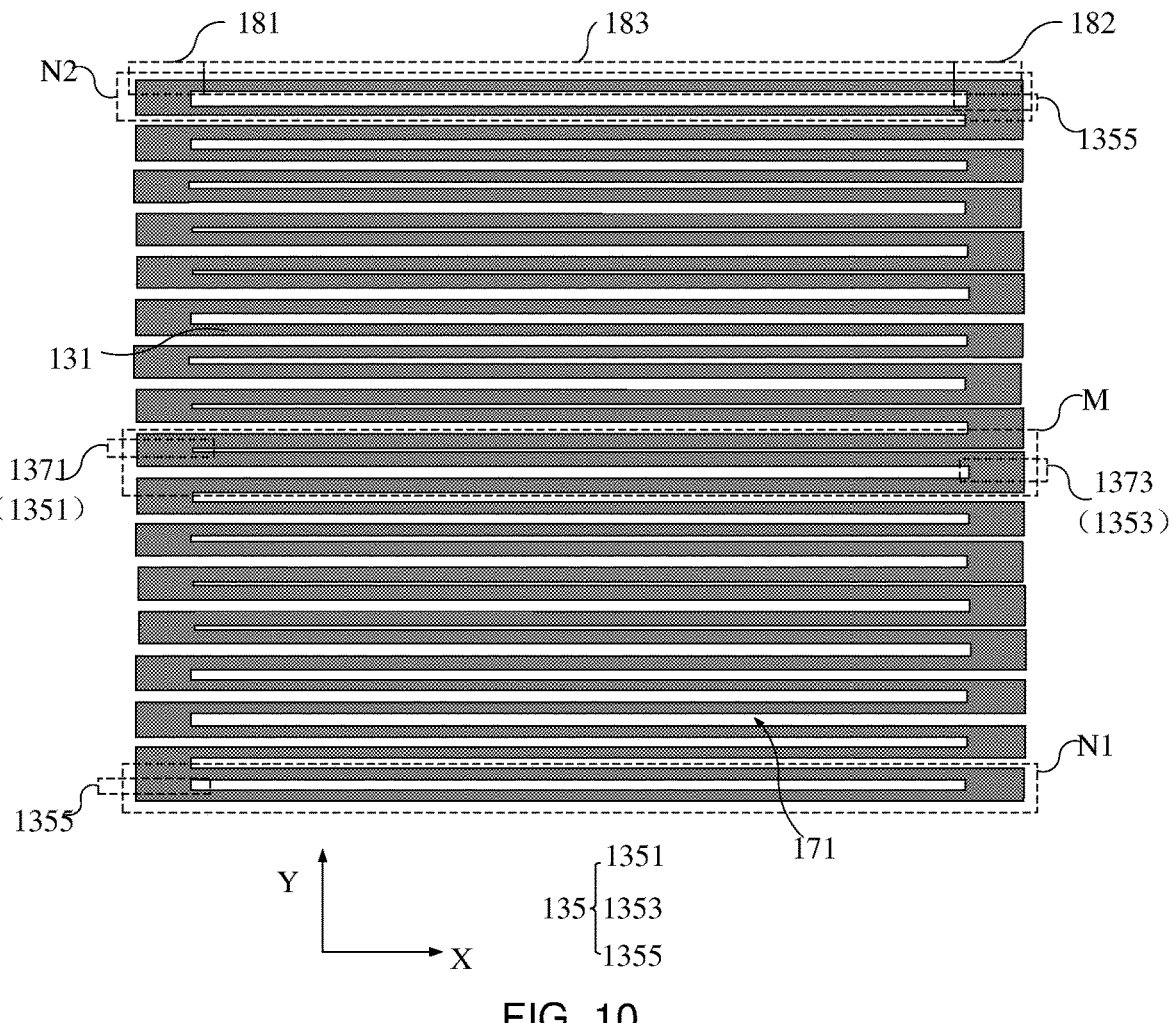
FIG. 10 is a structural diagram of first portions and a connection portion of another adhesive layer, in accordance with some embodiments.

FIG. 10 is a structural diagram of first portions 131 and a connection portion 135 of another adhesive layer 13 in accordance with some embodiments. As shown in FIG. 10, in some other embodiments, for three adjacent first portions 131 (e.g., at an M area in the figure), first end portions 181 of first two first portions 131 may be connected by a first connection segment 1371, and second end portions 182 of last two first portions 131 may be connected by a second connection segment 1373, so that multiple first portions 131 may be connected together in sequence, and the multiple first portions 131, multiple first connection segments 1371 and multiple second connection segments 1373 may form a strip structure. It can be understood that in the second direction Y, the first portion 131, the first connection segment 1371, the first portion 131, the second connection segment 1373 and the first portion 131 are arranged in sequence and alternate like this to form the strip structure. The above provision is beneficial to causing the plurality of first portions 131 to form a whole structure, and thus improving the stability of the plurality of first portions 131 and further improving the stability of the first end portions 181 and the second end portions 182 of the first portions 131, thereby avoiding jamming when the display panel 11 scrolls.

With continued reference to FIG. 10, the connection portion 135 may further include at least one third connection segment 1355. In the plurality of first portions 131, first end portions 181 of two adjacent first portions 131 located at the outermost side (at an N1 area in the figure, for example, the N1 area may be the outermost side away from the planar portion CA2) are connected by a third connection segment 1355. And/or in the plurality of first portions 131, second end portions 182 of two adjacent first portions 131 located at the outermost side (at an N2 area in the figure, for example, the N2 area may be the outermost side proximate to the planar portion CA2) may be connected by another third connection segment 1355.

For example, second end portions 182 of the two adjacent first portions 131 located at the outermost side (at the N1 area in the figure, for example, the N1 area may be the outermost side away from the planar portion CA2) are connected by a second connection segment 1373, so that the third connection segment 1355 and the second connection segment 1373 are arranged oppositely in the first direction X. In the plurality of first portions 131, by providing the third connection segment 1355 and the second connection segment 1373 between the two adjacent first portions 131 located at the outermost side, deformation of a first portion 131 located at the outermost side may be avoided, which is beneficial to improving the stability of the support bar 141 corresponding to the first portion 131 located at the outermost side, thereby avoiding jamming when the display panel 11 scrolls.

Similarly, first end portions 181 of the two adjacent first portions 131 located at the outermost side (at the N2 area in the figure, for example, the N2 area may be the outermost side proximate to the planar portion CA2) are connected by a first connection segment 1371, so that the another third connection segment 1355 and the first connection segment 1371 are arranged oppositely in the first direction X. In the plurality of first portions 131, by providing the another third connection segment 1355 and the first connection segment 1371 between the two adjacent first portions 131 located at the outermost side, deformation of another first portion 131 located at the outermost side may be avoided, which is beneficial to improving the stability of the support bar 141 corresponding to the another first portion 131 located at the outermost side, thereby avoiding jamming when the display panel 11 scrolls.

Figure 11:
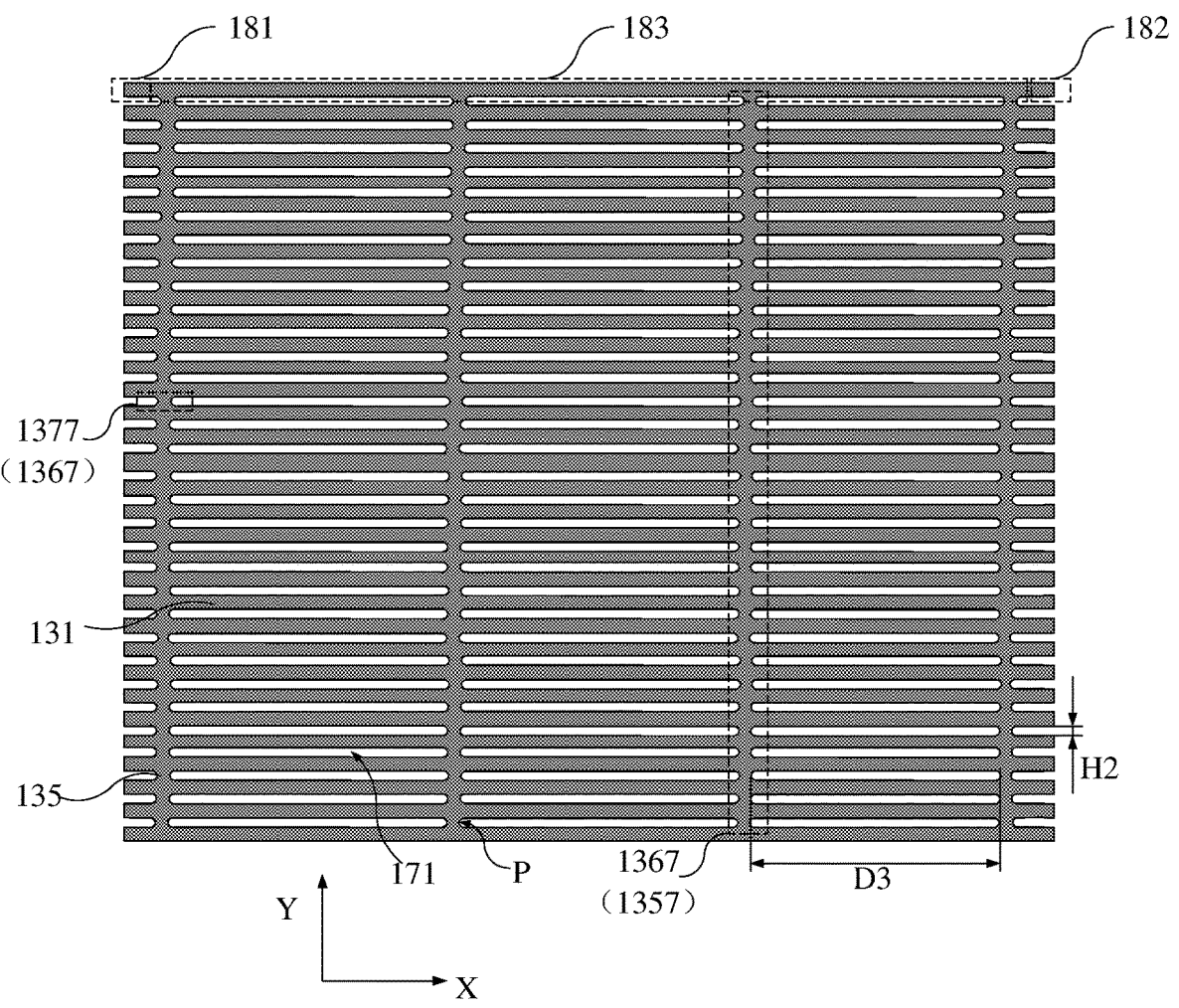
FIG. 11 is a structural diagram of first portions and a connection portion of yet another adhesive layer, in accordance with some embodiments.

FIG. 11 is a structural diagram of first portions 131 and a connection portion 135 of yet another adhesive layer 13 in accordance with some embodiments. Referring to FIG. 11, the connection portion 135 may further include a fourth connection portion 1357, and the fourth connection portion 1357 connects main portions 183 of at least two first portions 131. The provision of the fourth connection portion 1357 makes the main portions 183 of the at least two first portions 131 connected together, and this is beneficial to further improving the stability of the main portions 183 of the first portions 131, thereby avoiding jamming when the display panel 11 scrolls.

With continued reference to FIG. 11, the fourth connection portion 1357 may include a plurality of fourth connection groups 1367, and the plurality of fourth connection groups 1367 may be disposed at intervals in the first direction X. At least one fourth connection group 1367 includes a plurality of fourth connection segments 1377. Fourth connection segments 1377 in the same fourth connection group 1367 and first portions 131 may be arranged alternately in the second direction Y, so that the main portions 183 of the first portions 131 may be connected together, so as to further improve the stability of the main portions 183 of the first portions 131, thereby avoiding jamming when the display panel 11 scrolls. Moreover, the plurality of fourth connection groups 1367 arranged in the first direction X may be arranged at equal intervals, which is beneficial to achieving uniform force distribution on the main portions 183 of the first portions 131 and further improving the stability of the main portions 183 of the first portions 131, thereby avoiding jamming when the display panel 11 scrolls. For example, the fourth connection groups 1367 may be arranged at equal intervals in the first direction, so that the plurality of fourth connection segments 1377 may be distributed in an array, which is beneficial to improving the regularity of the adhesive layer 13 and simplifying the processing process.

In some examples, a distance D3 between two adjacent fourth connection groups 1367 in the first direction X may be in a range of 5 mm to 500 mm, inclusive. For example, the distance D3 between two adjacent fourth connection segments 1377 in the first direction X may be 5 mm, 250 mm or 500 mm.

With continued reference to FIG. 11, at least one end surface of the fourth connection segment 1377 in the first direction X may include a curved surface P, and the curved surface P is concave inward the fourth connection segment 1377. The provision of the curved surface P may reduce the local stress between the first portions 131 and the fourth connection segment 1377 and further improving the stability of the main portions 183 of the first portions 131, thereby avoiding jamming when the display panel 11 scrolls.

In some embodiments, a side of the curved surface P is tangent to a first portion 131 of two adjacent first portions 131, and another side of the curved surface P is tangent to another first portion 131 of the two adjacent first portions 131. For example, the curved surface P may be a semicircular surface. A side of the curved surface P proximate to the planar portion CA2 is tangent to the first portion 131 of the two adjacent first portions 131 proximate to the planar portion CA2, and another side of the curved surface P away from the planar portion CA2 is tangent to the first portion 131 of the two adjacent first portions 131 away from the planar portion CA2. A diameter of the curved surface P is a distance between two adjacent first portions 131 in the second direction Y, i.e., the distance H2 of the first gap 171 in the second direction Y. In some embodiments, the diameter of the curved surface P may be in a range of 0.3 mm to 50 mm, inclusive. For example, the diameter of the curved surface P may be 0.3 mm, 25 mm, or 50 mm. The above provision is beneficial to further reducing the local stress between the first portions 131 and the fourth connection segment 1377, thereby further improving the stability of the main portions 183 of the first portions 131.

In some embodiments, first end portions 181 of multiple first portions 131 may be connected by the first connection segment 1371, and second end portions 182 of multiple first portions 131 may be connected by the second connection segment 1373. In addition, main portions 183 of multiple first portions 131 may be connected by the fourth connection segment 1377. Thus, the stability of the first portions 131 may further be improved.

It is worth noting that the first portions 131 and the connection portion 135 may be integrally formed, that is, the first portions 131 and the connection portion 135 are disposed in the same layer and formed by the same process. For example, a whole layer of adhesive material may be formed first, and then part of the adhesive material may be removed using a round knife mold, so as to form the first portions 131 and the connection portion 135. It is worth noting that the first gaps 171 may also be formed by removing part of the adhesive material. The first portions 131 and the connection portion 135 are formed by the same process, which is beneficial to ensuring the connection strength between the first portions 131 and the connection portion 135, and thus ensuring the stability of the adhesive layer 13 and ensuring the stability of the support bars, thereby avoiding jamming when the display panel 11 scrolls. In some embodiments, the second portion 132, the first portions 131 and the connection portion 135 are provided in the same layer and formed by the same process, and details are not provided again here.

The foregoing descriptions are merely specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A display module, comprising:
a display panel including a bendable portion;
a first support layer located on a back surface of the display panel, the back surface being a surface of the display panel opposite to a display surface;
a second support layer located on a side of the first support layer away from the display panel, wherein the second support layer includes a plurality of support bars, and orthographic projections of the plurality of support bars on the display panel are located within the bendable portion; the plurality of support bars are disposed at intervals, and two adjacent support bars in the plurality of support bars have a first gap therebetween; and
an adhesive layer located between the second support layer and the first support layer, wherein the adhesive layer includes:
a plurality of first portions, orthographic projections of the plurality of first portions on the display panel being located within the bendable portion; the plurality of first portions being disposed at intervals, and two adjacent first portions in the plurality of first portions having a second gap therebetween; the second gap being communicated with the first gap; and
a connection portion connecting the plurality of first portions;
wherein the plurality of support bars and the plurality of first portions all extend in a first direction, the first direction is parallel to the first support layer; and
wherein the orthographic projection of the single support bar on the display panel is located within an orthographic projection of a first portion in the plurality of first portions on the display panel;
wherein each of the plurality of first portions includes a first end portion and a second end portion in the first direction; and
the connecting portion includes a first connecting portion and a second connecting portion; the first connection portion connects first end portions of at least two first portions, and the second connection portion connects second end portions of at least two first portions.

2. The display module according to claim 1, wherein
the first connection portion includes a plurality of first connection segments, and the second connection portion includes a plurality of second connection segments; and
for three adjacent first portions, first end portions of first two first portions are connected by a first connection segment, and second end portions of last two first portions are connected by a second connection segment.

3. The display module according to claim 2, wherein
a first connection segment is located between first end portions of two adjacent first portions, and a second connection segment is located between second end portions of two adjacent first portions.

4. The display module according to claim 2, wherein the connecting portion further includes at least one third connection segment; and in the plurality of first portions, first end portions of two adjacent first portions located on an outermost side are connected by a third connection segment; and/or in the plurality of first portions, second end portions of two adjacent first portions located on an outermost side are connected by another third connection segment.

5. The display module according to claim 1, wherein the adhesive layer includes a base material layer, a first adhesive layer and a second adhesive layer; the first adhesive layer is located on a side of the base material layer proximate to the first support layer, and the second adhesive layer is located on a side of the base material layer proximate to the second support layer.

6. The display module according to claim 5, wherein a material of the base material layer includes one or a combination of polyethylene terephthalate, thermoplastic polyurethane elastomer rubber, polyurethane foam, polyethylene foam, or polyvinyl chloride foam.

7. The display module according to claim 1, wherein the plurality of first portions and the connection portion are of an integral structure.

8. The display module according to claim 1, wherein the display panel further includes a planar portion, and the planar portion is connected to the bendable portion;

the second support layer further includes a support plate, and an orthographic projection of the support plate on the display panel is located within the planar portion; and the adhesive layer further includes a second portion, and an orthographic projection of the second portion on the display panel is located within the planar portion.

9. The display module according to claim 8, wherein a third gap is formed between a first portion located on an outermost side in the plurality of first portions and the second portion.

10. The display module according to claim 1, further comprising:

a rotating shaft, wherein the rotating shaft is located on a side of the plurality of support bars away from the bendable portion, the rotating shaft is configured to drive the bendable portion to be curled or unfolded; and a center line of the rotating shaft is parallel to the first direction.

11. A display apparatus, comprising:

the display module according to claim 1.

12. A display module, comprising:

a display panel including a bendable portion;

a first support layer located on a back surface of the display panel, the back surface being a surface of the display panel opposite to a display surface;

a second support layer located on a side of the first support layer away from the display panel, wherein the second support layer includes a plurality of support bars, and orthographic projections of the plurality of support bars on the display panel are located within the bendable portion; the plurality of support bars are disposed at intervals, and two adjacent support bars in the plurality of support bars have a first gap therebetween; and an adhesive layer located between the second support layer and the first support layer, wherein the adhesive layer includes:

a plurality of first portions, orthographic projections of the plurality of first portions on the display panel being located within the bendable portion; the plurality of first portions being disposed at intervals, and two adjacent first portions in the plurality of first portions having a second gap therebetween; the second gap being communicated with the first gap; and a connection portion connecting the plurality of first portions;

wherein the plurality of support bars and the plurality of first portions all extend in a first direction, the first direction is parallel to the first support layer;

an orthographic projection of a single support bar on the display panel and an orthographic projection of at least one first portion on the display panel have an overlap; and wherein the connecting portion includes a fourth connection portion;

each of the plurality of first portions includes a first end portion and a second end portion in the first direction, and a main portion located between the first end portion and the second end portion; and the fourth connection portion connects main portions of at least two first portions;

wherein a second direction is perpendicular to the first direction and parallel to the first support layer; and the fourth connection portion includes a plurality of fourth connection groups, the plurality of fourth connection groups are disposed at intervals in the first direction; at least one fourth connection group includes a plurality of fourth connection segments, and fourth connection segments in a same fourth connection group and the at least two first portions are disposed alternately in the second direction.

13. The display module according to claim 12, wherein at least one end surface of a fourth connection segment in the first direction includes a curved surface, and the curved surface is concave inward the fourth connection segment.

14. The display module according to claim 13, wherein a side of the curved surface is tangent to a first portion of two adjacent first portions, and another side of the curved surface is tangent to another first portion of the two adjacent first portions.

* * * * *